(12) United States Patent
Chen et al.

(10) Patent No.: US 7,802,616 B2
(45) Date of Patent: Sep. 28, 2010

(54) HEAT DISSIPATION APPARATUS WITH HEAT PIPES

(75) Inventors: Yong-Dong Chen, Shenzhen (CN); Guang Yu, Shenzhen (CN); Shih-Hsun Wung, Taipei Hsien (TW); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 344 days.

(21) Appl. No.: 11/757,196

(22) Filed: Jun. 1, 2007

(65) Prior Publication Data
US 2008/0295993 A1    Dec. 4, 2008

(51) Int. Cl.
*H05K 7/20*    (2006.01)
(52) U.S. Cl. .................. 165/104.33; 361/700
(58) Field of Classification Search ............ 165/104.33; 361/700
See application file for complete search history.

(56) References Cited

U.S. PATENT DOCUMENTS

| | | | | |
|---|---|---|---|---|
| 6,189,601 B1 * | 2/2001 | Goodman et al. | ...... | 165/104.33 |
| 7,128,135 B2 * | 10/2006 | Mok et al. | ............. | 165/104.33 |
| 7,357,174 B2 * | 4/2008 | Hsu et al. | ............... | 165/104.33 |
| 7,414,848 B2 * | 8/2008 | Zhou et al. | ............. | 165/104.33 |
| 7,423,877 B2 * | 9/2008 | Zhou et al. | .................. | 361/700 |
| 7,640,968 B2 * | 1/2010 | Peng et al. | ............. | 165/104.33 |
| 2005/0247437 A1 | 11/2005 | Ying et al. | | |
| 2007/0058343 A1 | 3/2007 | Deng et al. | | |
| 2007/0169919 A1 * | 7/2007 | Deng et al. | ............. | 165/104.33 |
| 2008/0169089 A1 * | 7/2008 | Wu et al. | ................ | 165/104.33 |

FOREIGN PATENT DOCUMENTS

| | | |
|---|---|---|
| CN | 2696124 Y | 4/2005 |
| CN | 2724375 Y | 9/2005 |
| CN | 1933710 A | 3/2007 |
| CN | 100562232 C | 11/2009 |
| TW | M246982 | 10/2004 |
| TW | 200714189 A | 4/2007 |

* cited by examiner

*Primary Examiner*—Leonard R Leo
(74) *Attorney, Agent, or Firm*—Jeffrey T. Knapp (57) ABSTRACT

A heat dissipation apparatus adapted for removing heat from a heat-generating electronic component, includes a conducting core, a plurality of conducting arms, a plurality of fins and a heat pipe assembly. The conducting core comprises a heat-absorbing portion contacting with the heat-generating electronic component. The conducting arms extend radially and outwardly from the conducting core. The fins extend outwardly from the respective conducting arms. Each of the heat pipes comprises an evaporating section thermally attached to the heat-absorbing portion of the conducting core and at least one condensing section thermally coupled to the respective conducting arm.

13 Claims, 7 Drawing Sheets

HEAT DISSIPATION APPARATUS WITH HEAT PIPES

BACKGROUND OF THE INVENTION

1. Field of the Invention

The present invention relates to heat dissipation apparatus, and particularly to a heat dissipation apparatus incorporating heat pipes for removing heat from a heat-generating electronic component.

2. Description of Related Art

Computer electronic components, such as central processing units (CPUs), generate a mass of heat during operation. If the heat is not removed quickly, it may deteriorate operational stability of the CPU and damage associated electronic equipment. A heat sink attached to a top surface of the CPU is required to remove heat therefrom.

A conventional heat sink is typically made of a highly heat-conductive metal, such as copper or aluminum, and generally includes a base for contacting the electronic component to absorb heat therefrom and a plurality of fins formed on the base for dissipating heat. However, as CPU (central processing unit) operating speeds have been upgraded dramatically, the conventional heat sinks can no longer meet the heat dissipation requirements of modern IC packages. In recent years, heat pipes have been widely used due to their great heat-transfer capability and various types of heat sinks equipped with heat pipes have been designed.

Figure 7:
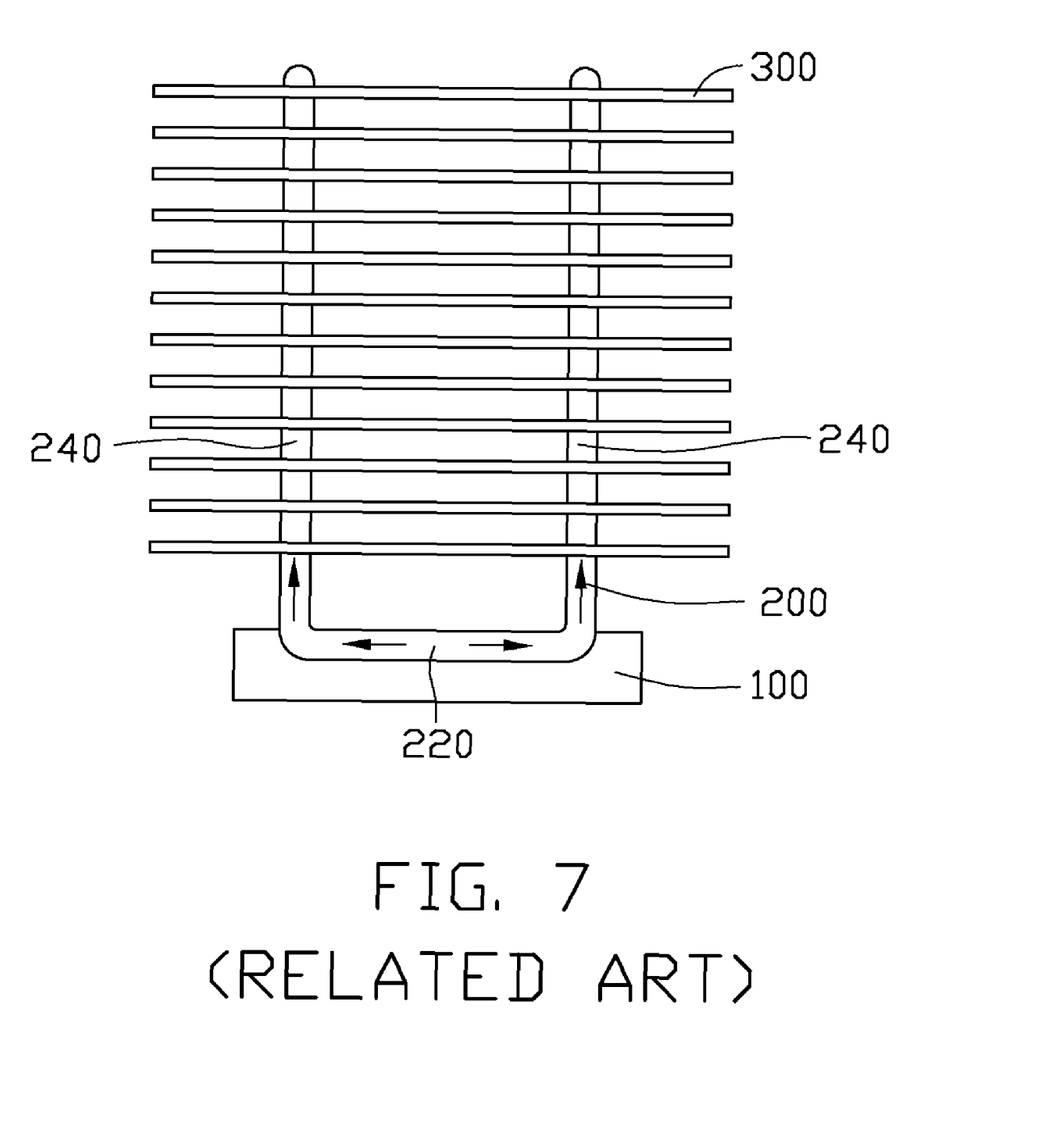
FIG. 7 is a perspective view of a heat sink according to related art.

A typical heat sink with heat pipes is illustrated in FIG. 7. The heat sink comprises a base 100, two vertical U-shaped heat pipes 200 (only one shown) installed on the base 100 and a plurality of parallel fins 300 parallel to the base 100. The heat pipe 200 has a straight evaporating portion 220 for engaging with the base 100 and two parallel condensing portions 240 perpendicular to the evaporating portion 220 and extending upwardly through the fins 300. The heat sink absorbs heat generated by an IC package (not shown) through the base 100. The heat is then speedily transferred, via the heat pipes 200, to the fins 300 for further heat dissipation.

However, this design for a heat sink has a disadvantage in its structure. The fins in this type of heat sink are made of thin pieces of metal and define a plurality of through holes therein for engaging with the heat pipes 200, thus the heat sink is complicated and costly in manufacturing. Additionally, the fins are so thin that do not have an adequate contact area with the heat pipes, thus adversely impacting heat transfer performance between the fins and the heat pipes.

What is needed is a heat dissipation apparatus with an enhanced heat dissipation performance whilst still being economical to manufacture.

SUMMARY OF THE INVENTION

A heat dissipation apparatus adapted for removing heat from a heat-generating electronic component, includes a conducting core, a plurality of conducting arms, a plurality of fins and a heat pipe assembly. The conducting core comprises a heat-absorbing portion contacting with the heat-generating electronic component. The conducting arms extend radially and outwardly from the conducting core. The fins extend outwardly from the respective conducting arms. Each of the heat pipes comprises an evaporating section thermally attached to the heat-absorbing portion of the conducting core and at least one condensing section thermally coupled to the respective conducting arm.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
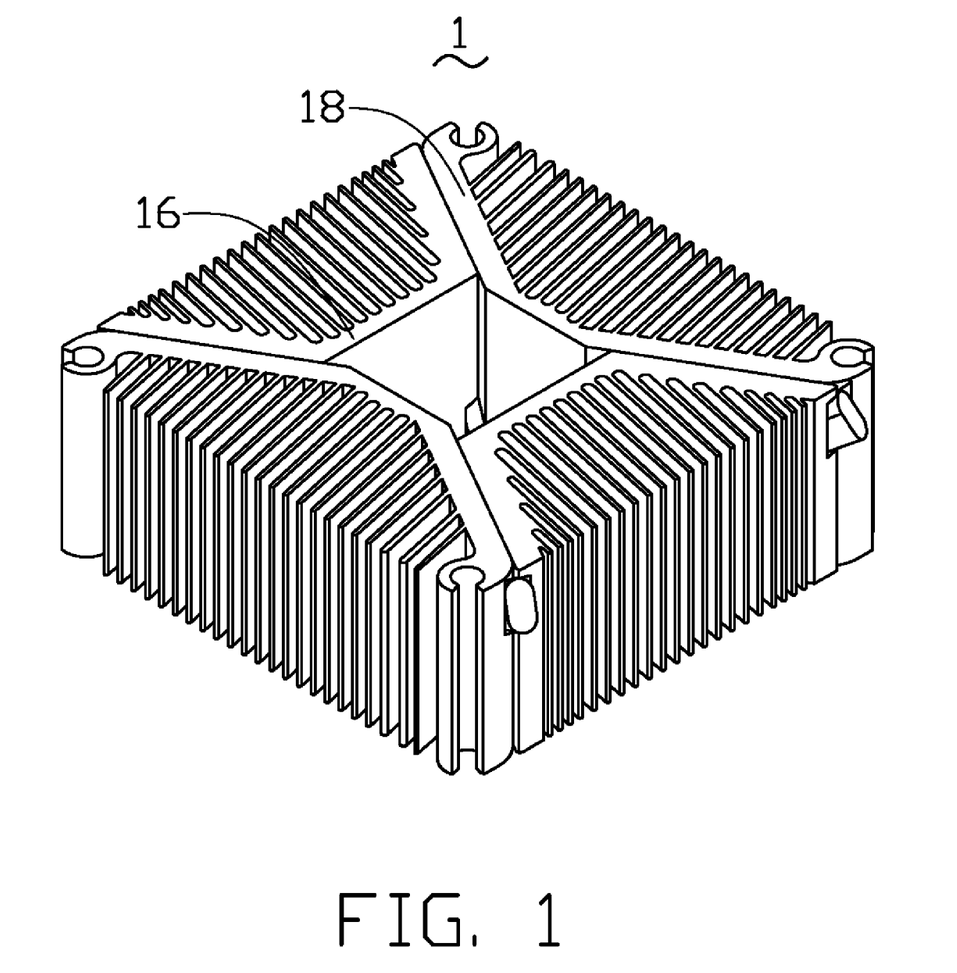
FIG. 1 is an isometric view of a heat dissipation apparatus in accordance with a first preferred embodiment.
Figure 2:
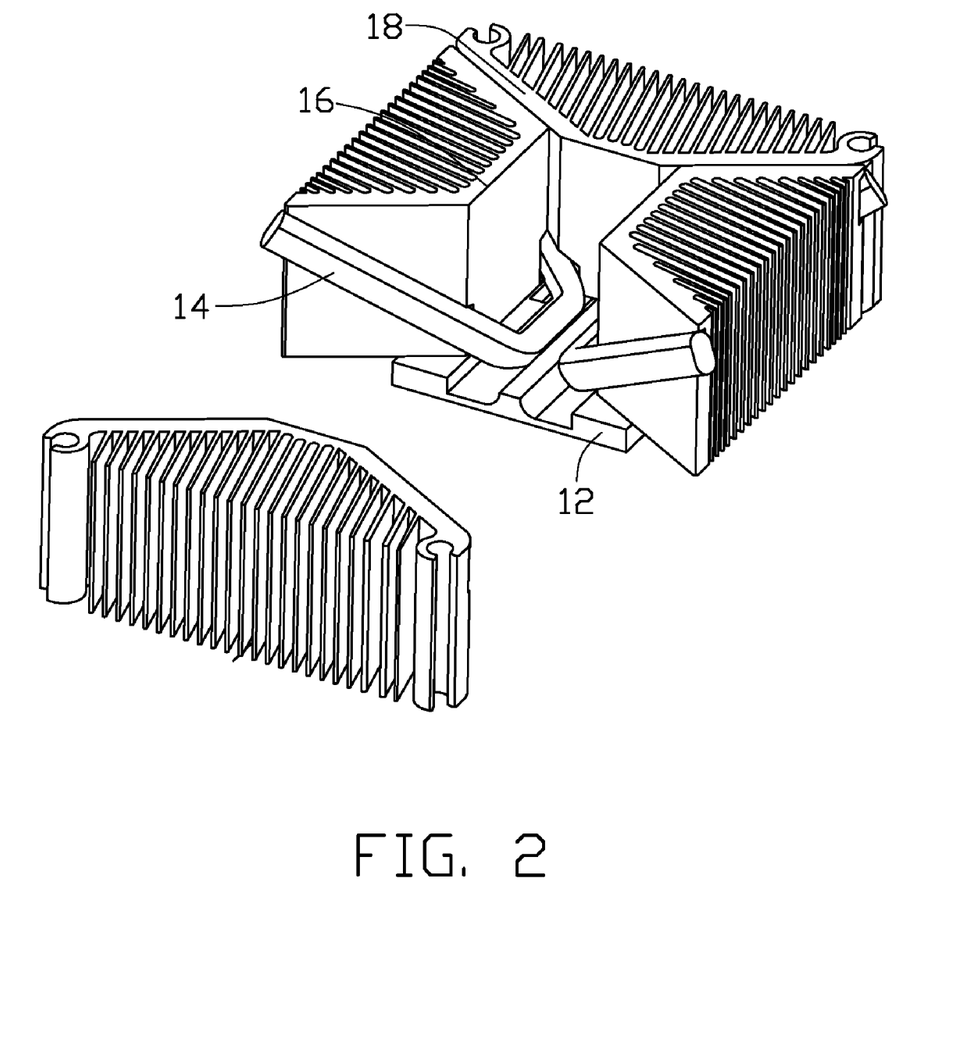
FIG. 2 is an isometric, partial exploded view of FIG. 1.
Figure 3:
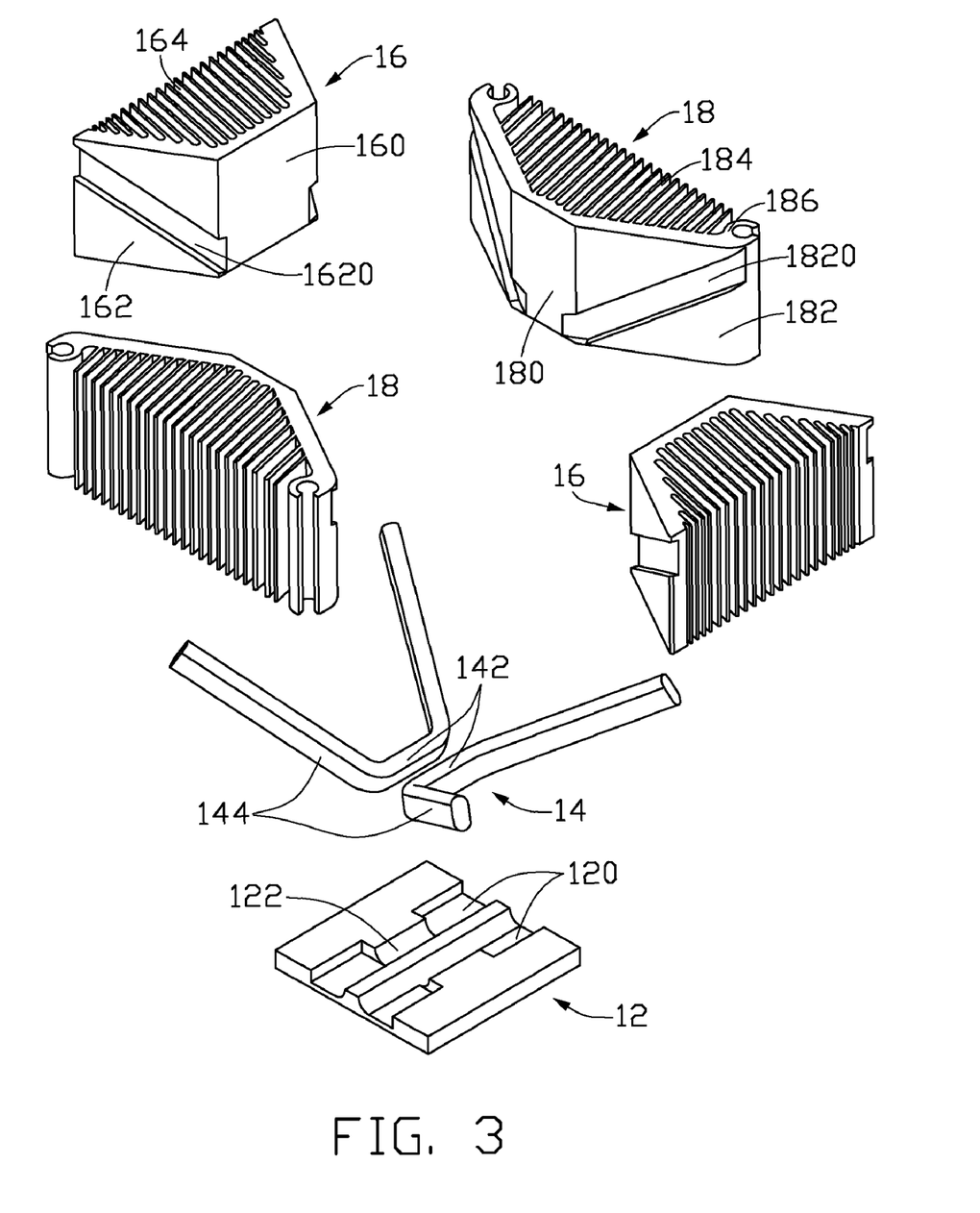
FIG. 3 is an isometric, exploded view of FIG. 1.

Referring to FIGS. 1 to 3, a heat dissipation apparatus 1 in accordance with a first preferred embodiment is illustrated. The heat dissipation apparatus 1 is configured (i.e., structured and arranged) for removing heat from a heat-generating electronic component (not shown) and comprises a heat-absorbing block 12, a plurality of heat pipes 14 thermally attached to the heat-absorbing block 12 and a plurality of heat sink units alternately assembled.

The heat-absorbing block 12 is a rectangular plate and made of a good material such as copper and aluminum. The heat-absorbing block 12 defines two spaced receiving grooves 120 in a top surface thereof. The receiving grooves 120 are parallel to a pair of opposite edges of the heat-absorbing block 12 and located at a middle of the heat-absorbing block 12. The receiving grooves 120 each has a contacting protrusion 122 extending inwardly from a middle portion of an outer sidewall thereof, which defines a inclined face at a distal end thereof, for maximizing a contacting area between the heat pipes 14 and the heat-absorbing block 12.

The heat pipes 14 can be of various numbers in different embodiments; the number is two in this embodiment. The two heat pipes 14 are flattened and identical to each other. The heat pipes 14 each comprise an elongated evaporating section 142 and two condensing sections 144 extending obliquely toward one lateral side from two opposite ends of the evaporating section 142. The evaporating sections 142 are thermally engaged in the respective receiving grooves 120 of the heat-absorbing block 12 and intimately contact with the contacting protrusions 122 of the receiving grooves 120.

The heat sink units include a pair of first heat sink units 16 and a pair of the second heat sink units 18. The first heat sink units 16 each are formed integrally by aluminum extrusion, comprise a first spreader 160, two second conducting wings 162 extending obliquely and outwardly from two opposite edges of the first spreader 160, and a plurality of parallel first fins 164 extending outwardly from the first spreader 160 and the first conducting wings 164. The first spreaders 160 are rectangular plates and stand vertically on the heat-absorbing block 12. The first conducting wings 162 each define a first groove 1620 therein, which extends diagonally and upwardly.

The first fins 164 arranged between the two corresponding first wings 162, are perpendicular to the corresponding first spreader 160.

The second heat sink units 18 are similar to the first heat sink units 16, formed by aluminum extrusion and each comprise a second spreader 180 standing vertically on the heat-absorbing block 12, two second conducting wings 182 extending slantwise from two opposite edges of the second spreader 180 and a plurality of second fins 184 extending outwardly from the second spreader 180 and the two second conducting wings 182. The second spreader 180 as tall as that of the first spreader 160 and has a width smaller than that of the first spreader 160. The second conducting wings 182 each define a second groove 1820 diagonally therein corresponding to the first groove 1620 of the first heat sink units 16. Each of the second conducting wings 182 defines a fixing post 186 with an opening through hole (not labeled) therein at a distal end thereof, for mounting a fan (not shown) on the heat dissipation apparatus 1. The second groove 1820 incorporates the corresponding first groove 1620 to define a channel for receiving the condensing section 144 of the heat pipe 14 therein.

Referring to the FIGS. 1 and 2 again, in assembly of the heat dissipation apparatus 1, the two first heat sink units 16 and the two second heat sink units 18 are alternately assembled together and disposed on the heat-absorbing blocks 12. The first conducting wing 162 of the first heat sink unit 16 co-operates with a neighboring second conducting wing 182 of the second heat sink unit 18 to form a conducting arm (not labeled). The first groove 1620 of the first conducting wing 162 co-operates with the second groove 1820 of the second conducting wing 182 adjoining the first conducting wing 162 to define the channel in the conducting arm. The evaporating sections 142 of the heat pipes 14 accommodated in the respective receiving grooves 120 of the heat-absorbing block 12 engage thermally with the contacting protrusions 122 of the receiving grooves 120. The condensing sections 144 of the heat pipes 14 received in the corresponding channels in the conducting arms are coated with thermal interface material to enhance transfer efficiency between the heat pipes 14 and the heat sink units 16, 18.

As description above, the two first spreaders 160 of the first heat sink units 16 and the two second spreaders 180 of the second heat sink units 18 vertically standing on the heat-absorbing block 12, are assembled together to form a conducting member which is a hollow prism in this embodiment. In some embodiment, the heat-absorbing block 12 is integrated with the conducting member to form a conducting core, and the heat-absorbing block 12 serving as a heat-absorbing portion of the conducting core.

Figure 4:
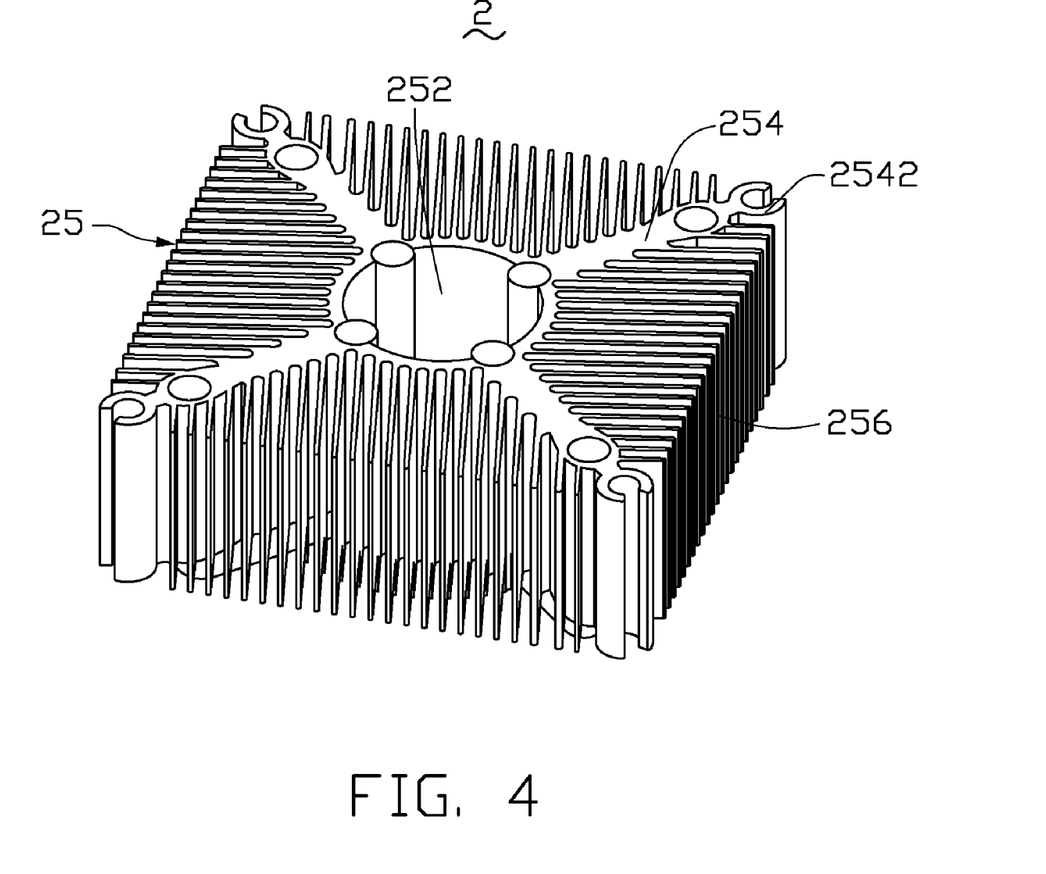
FIG. 4 is an isometric view of a heat dissipation device in accordance with a second preferred embodiment.
Figure 5:
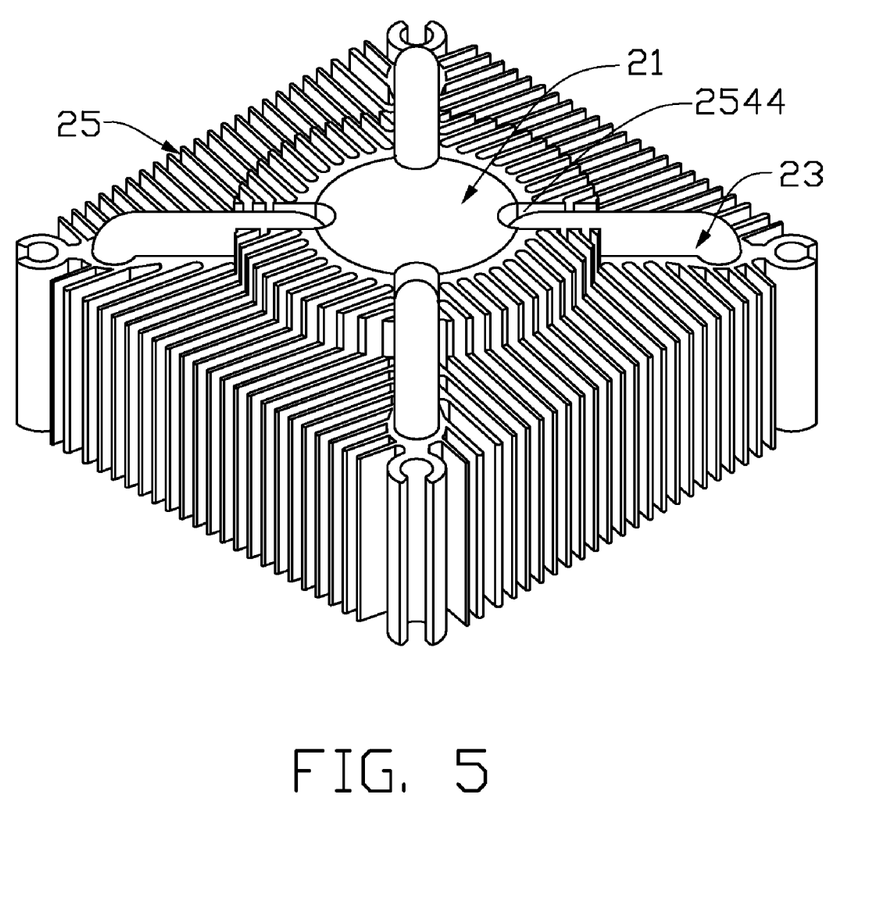
FIG. 5 is an inverted view of FIG. 4.
Figure 6:
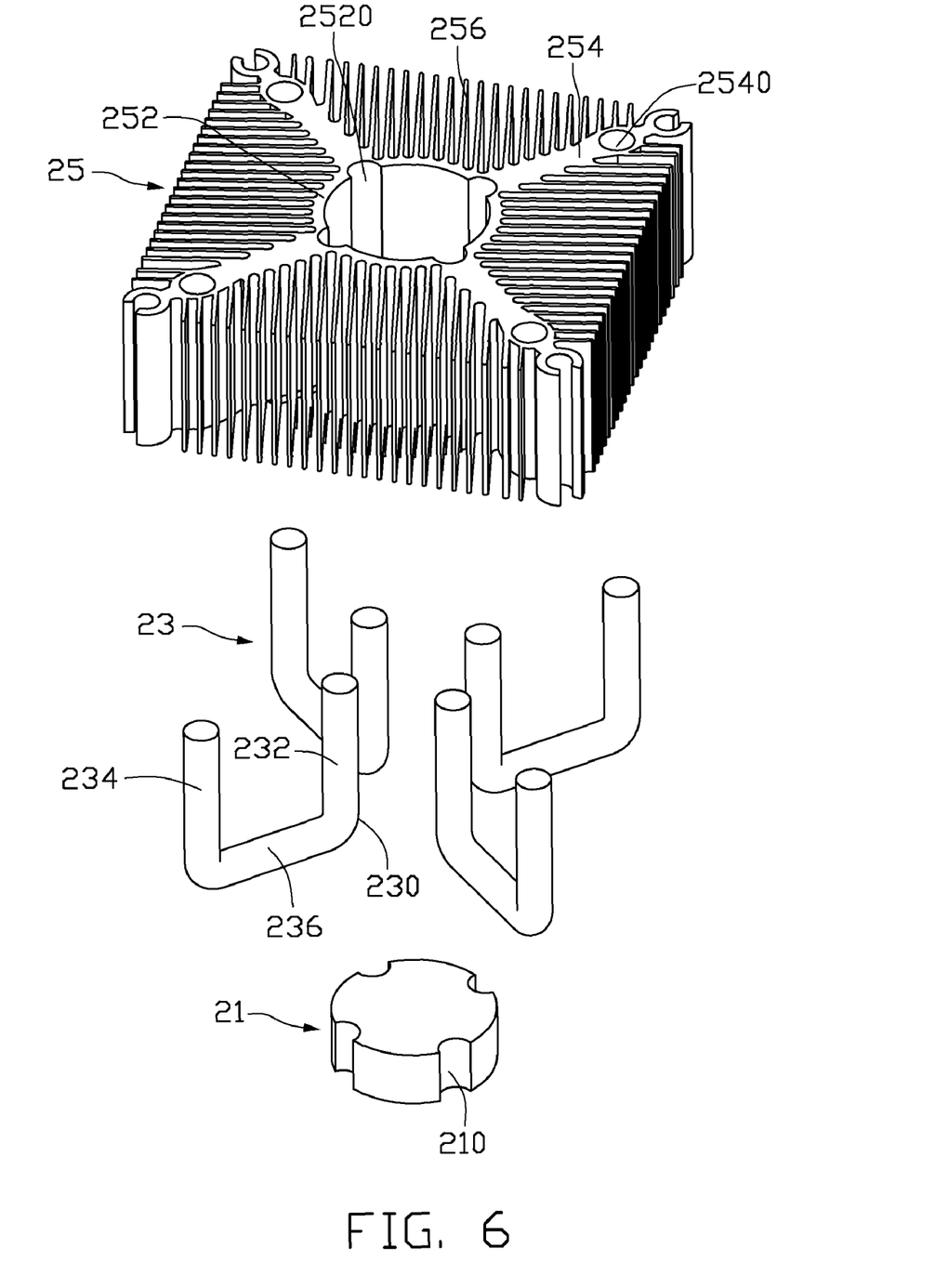
FIG. 6 is an isometric, exploded view of FIG. 4.

As shown in the FIGS. 4 to 6, a heat dissipation apparatus 2 according to a second prefer embodiment of the present invention, comprises a heat-absorbing member 21, four identical heat pipes 23 and a heat sink 25.

The heat-absorbing member 21 made of a good conducting material such as copper, is flat-column shaped and defines four recesses 210 symmetrically in a rim thereof, for engaging with the heat pipes 23.

The heat pipes 23 each are circular in cross section, and U-shaped in profile. Each of the heat pipes 23 comprises an evaporating section 230 at a turning thereof, a first condensing section 232 located above the evaporating section 230, a second condensing section 234 parallel to the first condensing section 232 and a third condensing section 236. The third condensing section 236 is perpendicular to the first condensing section 232 and the second condensing section 234, and connects the evaporating section 230 and the second condensing section 234 together. The evaporating section 230 is thus positioned at the turning between the first condensing section 232 and the third condensing section 236.

The heat sink 25 is substantially rectangular and integrally formed by aluminum extrusion. The heat sink 25 comprises a conducting member, four conducting arms 254 extending outwardly from the conducting member and a plurality of fins 256 radially extending from the conducting member and arms 254. The conducting member is a cylinder 252 with a hollow hole therein and symmetrically defines four vertical recesses 2520 in inner wall of the cylinder 252 for thermally engaging with the first condensing sections 232 of the heat pipes 23. The four conducting arms 254 extend outwardly from a circumference of the cylinder 252 and are aligned with the four respective recesses 2520 of the cylinder 252. Each of the conducting arms 254 defines a vertical channel 2540 adjacent to a distal end thereof, for receiving the second condensing section 234 of one heat pipe 23. Each of the conducting arms 254 defines a fixing post 2542 with an opening through hole (not labeled) therein at a distal end thereof, for mounting a fan (not shown) on the heat dissipation apparatus 2. Each of the conducting arms 254 defines a slot 2544 in a bottom thereof for receiving the third condensing section 236 of the heat pipe 23. The slots 2544 each respectively communicate with the recess 2520 of the cylinder 252 and the channel 2540 of the conducting arm 254.

A bottom of the cylinder 252 and portions of the fins 256 around the cylinder 252 defines a circular platform protruding from remains of the fins 256. The platform and a bottom surface of the heat-absorbing member 21 that are snugly received in the cylinder 252 are coplanar, so as to form a contacting interface for thermally contacting with the heat-generating electronic component. In an alternative embodiment, the conducting member—the cylinder 252 is integrated with the heat-absorbing member 21 to form a conducting core, wherein the heat-absorbing member 21 acts as a heat-absorbing portion of the conducting core to contact with the heat-generating electronic component; the first condensing sections 232 of the heat pipes 23 extend upwardly in the conducting core.

Referring to FIGS. 4 and 5 again, in assembly of the heat dissipation apparatus 2, the heat-absorbing member 21 snugly received in the cylinder 252 of the heat sink 25 and contacts with the heat-generating electronic component. The recesses 210 of the heat-absorbing member 21 incorporate corresponding lower portions of the recesses 2520 of the cylinder 252 respectively to define through holes that engagingly receive the evaporating sections 230 of the heat pipes 23. The first condensing sections 232 of the heat pipes 23 pass through the corresponding through holes formed by recesses 210 and 2520 to engage in the recesses 2520 of the cylinder 252 respectively. The second condensing sections 234 and the third condensing sections 236 of the heat pipes 23 are received engagingly in the corresponding channels 2540 and the slots 2544 of the conducting arms 254 respectively.

According to the aforementioned description, the heat dissipation apparatus of the present invention by aluminum extrusion is simple and economical in manufacture, also convenient in assembling process. In addition, the channels formed by aluminum extrusion in the conducting arms of the heat dissipation apparatus thermally and adequately contact with the condensing sections of heat pipes. Therefore, heat transfer between the heat pipes and the conducting arms is so dramatically enhanced that heat absorbed by the heat-absorbing member and the evaporating section of the heat pipes is conducted to the whole fins symmetrically and promptly for dissipating to the surrounding atmosphere.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation apparatus adapted for removing heat from a heat-generating electronic component, comprising:
   a conducting core having a heat-absorbing portion contacting with the heat-generating electronic component;
   a plurality of conducting arms extending radially and outwardly from the conducting core;
   a plurality of fins extending outwardly from the respective conducting arms; and
   a heat pipe assembly comprising a plurality of U-shaped heat pipes each having an evaporating section thermally attached to the heat-absorbing portion of the conducting core and a pair of upwardly extending condensing sections, at least one condensing section thermally coupled to the respective conducting arm.

2. The heat dissipation apparatus as claimed in claim 1, wherein the conducting arms each define a channel therein, and the at least one condensing section of each of the heat pipes thermally engages in the channel.

3. The heat dissipation apparatus as claimed in claim 2, wherein the heat-absorbing portion of the conducting core is a heat-absorbing block.

4. The heat dissipation apparatus as claimed in claim 3, wherein the conducting core comprises a conducting member detachably and thermally attached to the heat-absorbing block.

5. The heat dissipation apparatus as claimed in claim 4, wherein the conducting member is a hollow prism formed by four spreaders standing on the heat-absorbing block.

6. The heat dissipation apparatus as claimed in claim 5, wherein the spreaders each have two conducting wings extending outwardly from two opposite ends thereof, each of the conducting arms is made up of two adjoining conducting wings.

7. The heat dissipation apparatus as claimed in claim 6, wherein the two adjoining conducting wings that forming the conducting arm respectively define two corresponding receiving grooves for forming the channel of the conducting arm.

8. The heat dissipation apparatus as claimed in claim 4, wherein the conducting member is a hollow cylinder, the heat-absorbing block is received in the cylinder with a bottom surface thereof leveling with a bottom of the cylinder.

9. The heat dissipation apparatus as claimed in claim 8, wherein the cylinder defines a plurality of recesses in an inner wall thereof, the conducting arms extend outwardly from a circumference of the cylinder and are aligned with the respective recesses of the cylinder.

10. The heat dissipation apparatus as claimed in claim 9, wherein the channel is vertically located in the conducting arm and adjacent to a distal end of the conducting arm.

11. The heat dissipation apparatus as claimed in claim 10, wherein the conducting arms each define a slot in a bottom thereof, the slot respectively communicates with the corresponding recess of the cylinder and the channel of the conducting arm.

12. The heat dissipation apparatus assembly as claimed in claim 11, wherein the heat pipe assembly comprises four U-shaped heat pipes each having a first evaporating section and three condensing sections, the evaporating section thermally engages with the heat-absorbing block, the three condensing sections are received in the recesses of the cylinders, the slots and the channels of the conducting arms respectively.

13. The heat dissipation apparatus assembly as claimed in claim 11, wherein the conducting core, the conducting arms and the fins are formed integrally by aluminum extrusion.

* * * * *